(12) United States Patent
Li et al.

(10) Patent No.: US 8,152,150 B2
(45) Date of Patent: Apr. 10, 2012

(54) FASTENING DEVICE FOR ELECTRONIC COMPONENT

(75) Inventors: Jian-Hua Li, Shenzhen (CN); Hung-Bin Wu, Taipei Hsien (TW); Yu-Rong Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 430 days.

(21) Appl. No.: 12/494,322

(22) Filed: Jun. 30, 2009

(65) Prior Publication Data
US 2010/0064488 A1   Mar. 18, 2010

(30) Foreign Application Priority Data
Sep. 18, 2008   (CN) .......................... 2008 1 0304546

(51) Int. Cl.
*B23Q 3/18*   (2006.01)

(52) U.S. Cl. .......................... 269/305; 269/903; 118/503
(58) Field of Classification Search .................. None
See application file for complete search history.

(56) References Cited

U.S. PATENT DOCUMENTS

| 2,467,604 A | * | 4/1949 | Tinnerman et al. ........... 403/387 |
| 4,759,488 A | * | 7/1988 | Robinson et al. .............. 228/43 |
| 4,810,616 A | * | 3/1989 | Grabbe et al. ................ 430/269 |
| 4,971,676 A | * | 11/1990 | Doue et al. .................... 118/503 |
| 5,501,436 A | * | 3/1996 | Miller ............................ 269/47 |
| 2008/0279560 A1 | * | 11/2008 | Osawa et al. ................. 398/130 |

* cited by examiner

*Primary Examiner* — Jack W. Lavinder
(74) *Attorney, Agent, or Firm* — Altis Law Group, Inc.

(57) ABSTRACT

A fastening device includes a base and a fastening member. The base defines a receiving space for receiving an electronic component. The fastening member includes a fastening portion and an elastic abutting portion. The fastening portion is fixed to the base. The elastic abutting portion extends from the fastening portion upwards and through the base and is configured for securing the electronic component in the receiving space.

9 Claims, 5 Drawing Sheets

FASTENING DEVICE FOR ELECTRONIC COMPONENT

BACKGROUND

1. Technical Field

The present disclosure relates to fastening technology, and particularly, to a fastening device for an electronic component.

2. Description of Related Art

Electronic device usually includes numerous electronic components assembled together. Before assembling these electronic components into the electronic device, they may be tested, printed, etc. During these operations, the electronic components have to be firmly fixed.

Therefore, a fastening device for an electronic component is desired.

DETAILED DESCRIPTION

Figure 1:
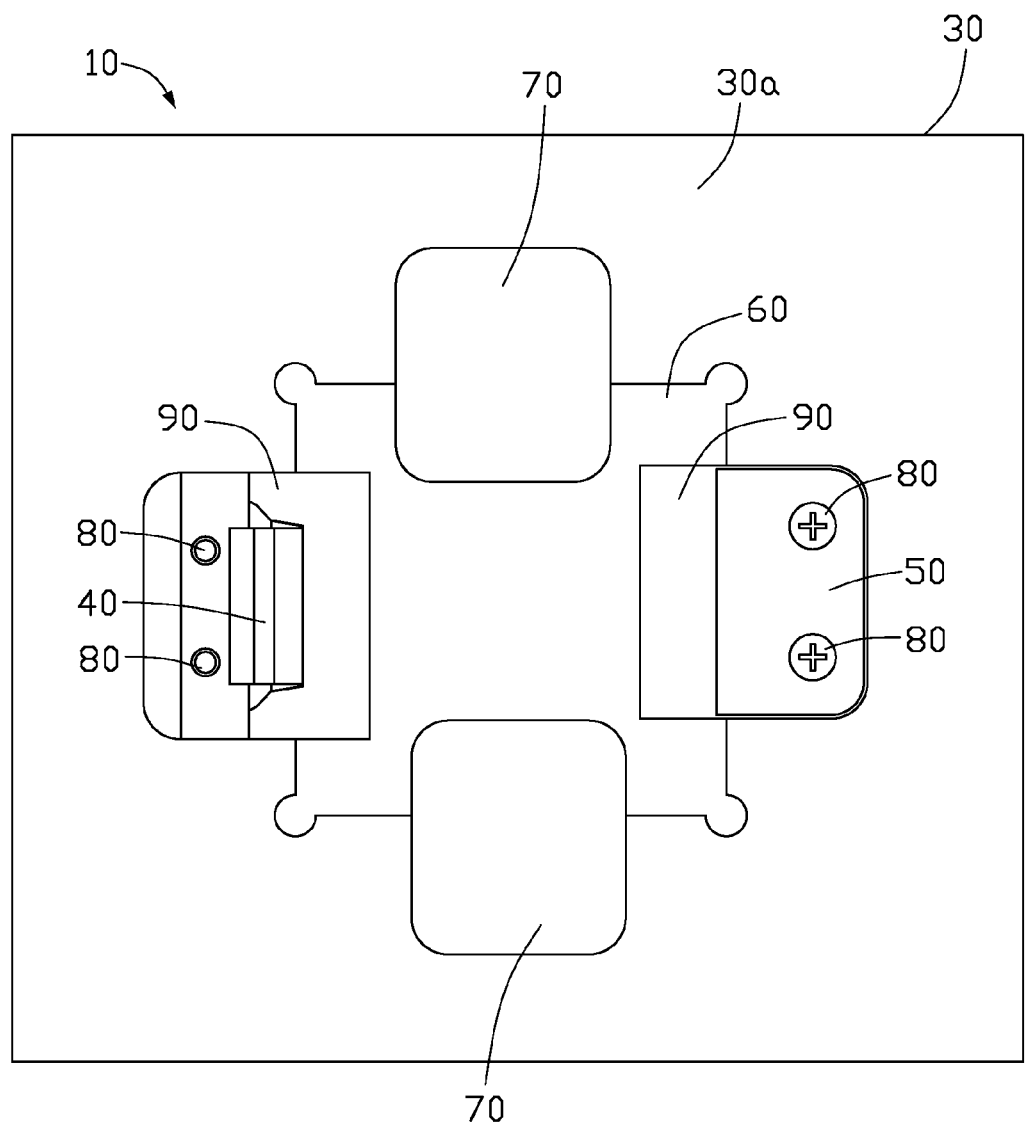
FIG. 1 is a top view of a fastening device including a fastening member, according to an exemplary embodiment.
Figure 2:
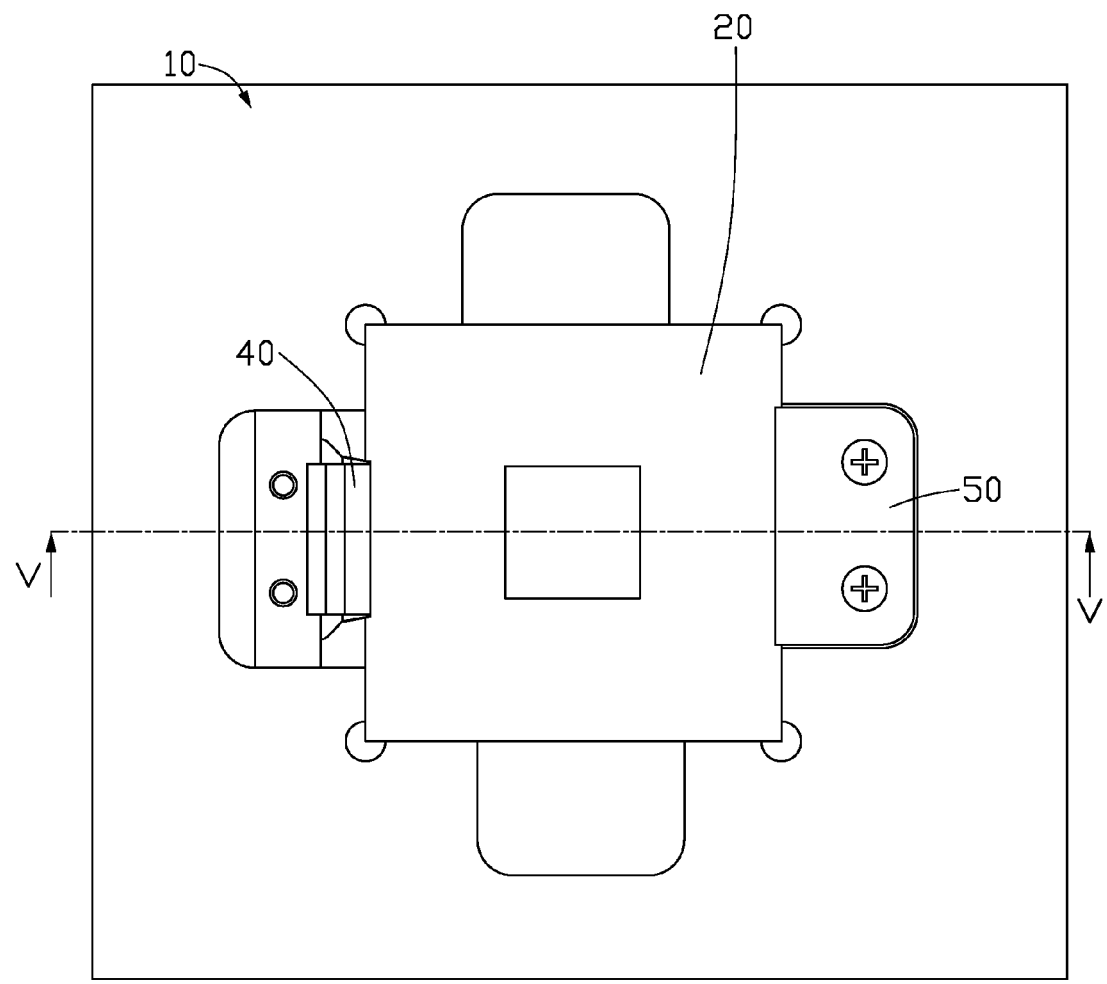
FIG. 2 is similar to FIG. 1, but showing an electronic component fixed by the fastening device.

Referring to FIGS. 1 and 2, a fastening device 10 for fastening an electronic component 20, according to an exemplary embodiment, is shown. The electronic component 20 is approximately a cuboid and may be a central processing unit, or an integrated circuit chip, etc.

The fastening device 10 includes a base 30, an elastic fastening member 40, and a stopping member 50.

Figure 5:
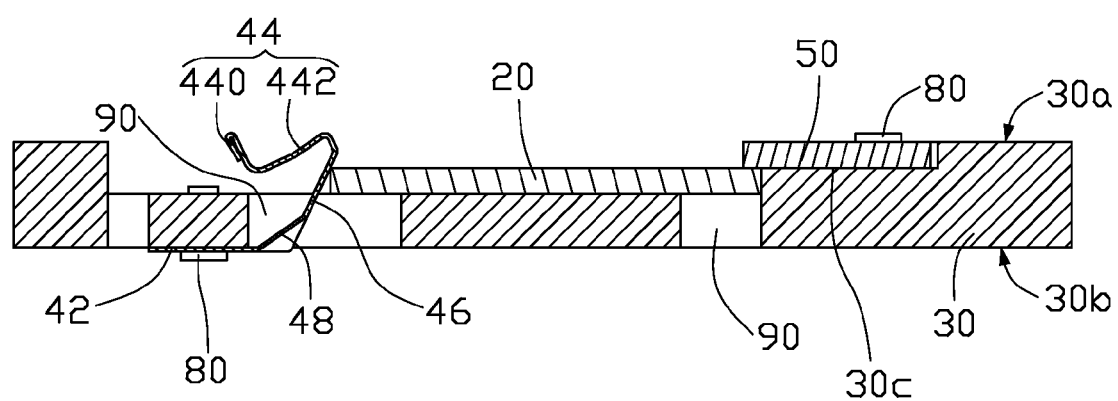
FIG. 5 is a cross-sectional view taken along line V-V of FIG. 2.

The base 30 includes a top surface 30a and a bottom surface 30b (see FIG. 5). A receiving space 60 is defined in the top surface 30a of the base 30. The electronic component 20 is fittingly received in the receiving space 60. Two first through holes 70 are symmetrically defined through the top surface 30a and the bottom surface 30b and communicate with the receiving space 60. An operator may place the electronic component 20 into the receiving space 60 and get the electronic component 20 from the receiving space 60 through the two first through holes 70 conveniently.

Two second through holes 90 are defined through the base 30 and communicate with the receiving space 60, with locations different from those of the first through holes 70.

Figure 3:
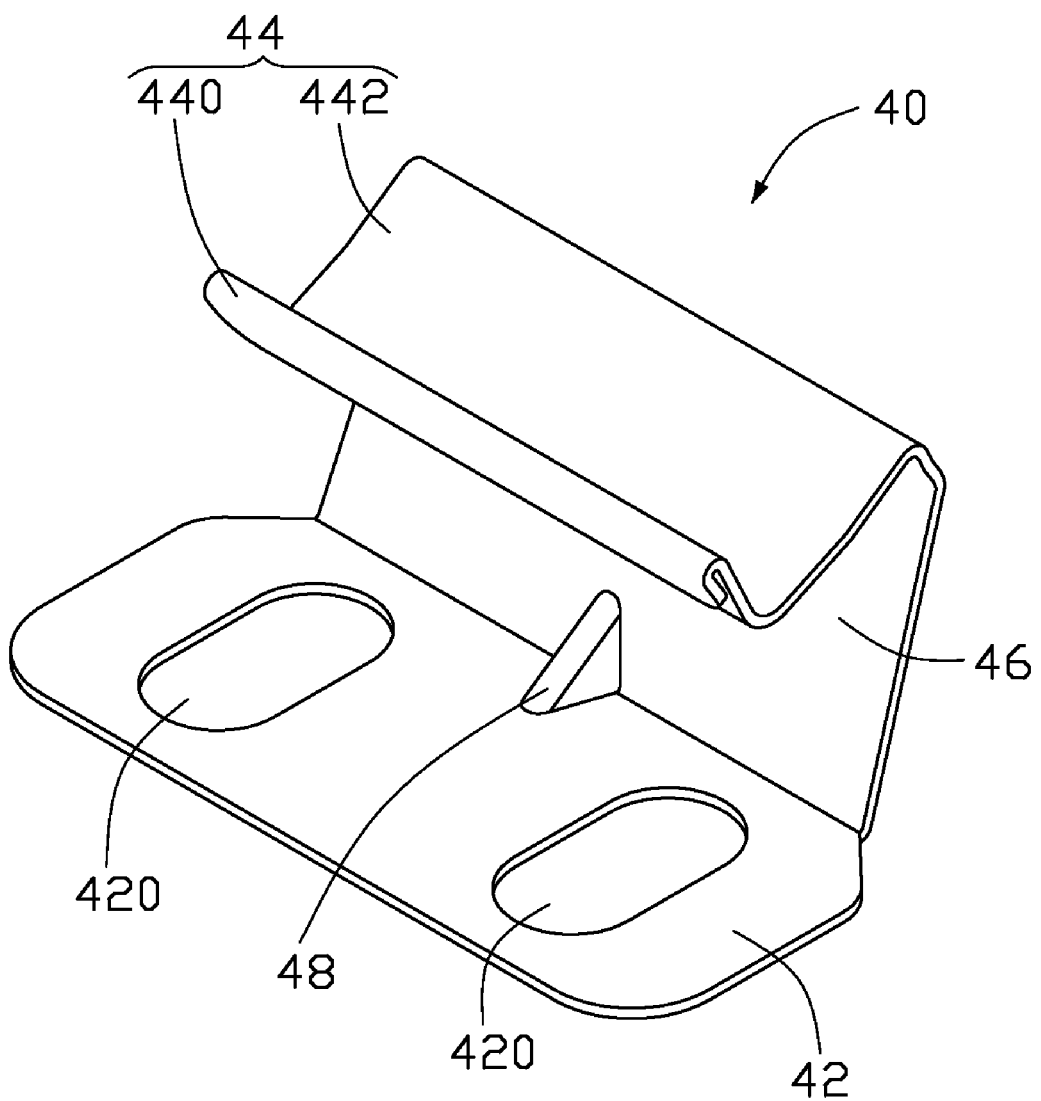
FIG. 3 is an isometric view of the fastening member of FIG. 1.
Figure 4:
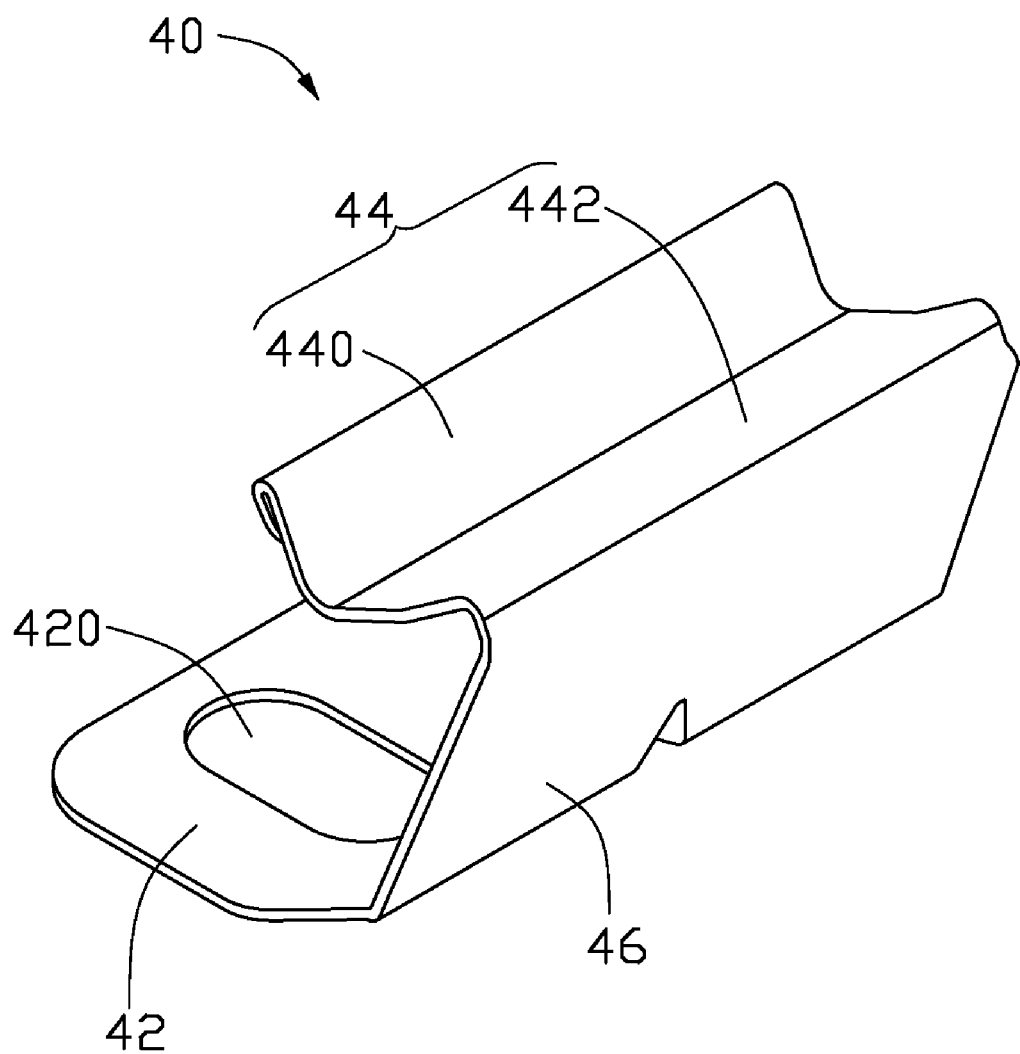
FIG. 4 is similar to FIG. 3, but viewed the fastening member from another angle.

Further referring to FIGS. 3 to 5, the fastening member 40 is fixed to the base 30, corresponding to one second through hole 90. The fastening member 40 includes a fastening portion 42, an operation portion 44 opposite to the fastening portion 42, an elastic abutting portion 46 connecting the fastening portion 42 to the operation portion 44, and a reinforcing tab 48 formed between the fastening portion 42 and the elastic abutting portion 46.

The fastening portion 42 is approximately a planar plate. Two fastening slots 420 are defined through the fastening portion 42. Two screws 80 extend through the two fastening slots 420 respectively and are screwed into the base 30 from the bottom surface 30b so that the fastening member 40 is fixed to the base 30. When the two screws 80 are unscrewed, the fastening member 40 can be moveable along the two screws 80 so that a position of the fastening member 40 can be adjusted. After the position of the fastening member 40 is determined, the two screws 80 are fastened.

The elastic abutting portion 46 is approximately a planar plate and extends through the one second through hole 90. An included angle between the fastening portion 42 and the elastic abutting portion 46 is an obtuse angle. An orthogonal projection of the elastic abutting portion 46 is partially on the receiving space 60.

The operation portion 44 extends from the elastic abutting portion 46 and is approximately V-shaped, and includes a front arm 440 and a rear arm 442. The rear arm 442 connects the front arm 440 to the elastic abutting portion 46. The reinforcing tab 48 is approximately a triangular prism. The reinforcing tab 48 assists the elastic abutting portion 46 to restore to its original position. The reinforcing tab 48 is formed by punching process, using the fastening portion 42 and the elastic abutting portion 46 in this embodiment.

The stopping member 50 is approximately a planar plate. A stepped portion 30c opposite to the fastening member 40 is formed on the top surface 30a of the base 30. Another two screws 80 extend through the stopping member 50 and are screwed into the stepped portion 30c so that the stopping member 50 is fixed on the stepped portion 30c, opposite to the fastening member 40. The stopping member 50 partially protrudes from the stepped portion 30c and partially covers the receiving space 60. When the electronic component 20 is received in the receiving space 60, the stopping member 50 prevents the electronic component 20 from slipping out of the receiving space 60.

When the electronic component 20 is to be placed in the receiving space 60, the front arm 440 of the operation portion 44 is pushed away from the receiving space 60 to move the orthogonal projection of the elastic abutting portion 46 out of the receiving space 60. The elastic abutting portion 46 is elastically deformed. Then, the electronic component 20 is placed in the receiving space 60. The front arm 440 of the operation portion 44 is released, and the elastic abutting portion 46 is restored to secure the electronic component 20 in the receiving space 60. As a result, the electronic component 20 is firmly fixed in the receiving space 60 by cooperation of the fastening member 40 and the stopping member 50.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A fastening device, comprising:
    a base comprising a top surface and a bottom surface and defining a through hole through the top surface and the bottom surface, and a receiving space in the top surface for receiving an electronic component; and
    a fastening member comprising a fastening portion and an elastic abutting portion, the fastening portion fixed to the base, the elastic abutting portion extending from the fastening portion upwards and through the base and configured for securing the electronic component in the receiving space, wherein the fastening portion is fixed to the bottom surface and the elastic abutting portion extends through the through hole.

2. The device as claimed in claim 1, wherein the fastening portion and the elastic abutting portion are approximately planar plates.

3. The device as claimed in claim 1, further comprising at least one screw extending through the fastening portion and screwed into the base to fasten the fastening member to the base.

4. The device as claimed in claim 1, wherein the fastening member further comprises an operation portion extending from the elastic abutting portion and opposite to the fastening portion.

5. The device as claimed in claim 4, wherein the operation portion is approximately V-shaped.

6. The device as claimed in claim 1, wherein the fastening member comprise a reinforcing tab formed between the fastening portion and the elastic abutting portion.

7. The device as claimed in claim 6, wherein the reinforcing tab is approximately a triangular prism and is formed by punching process.

8. The device as claimed in claim 1, further comprising a stopping member fixed to the top surface of the base and opposite to the fastening member and partially covering the receiving space.

9. The device as claimed in claim 1, wherein two through holes are symmetrically defined through the base and communicate with the receiving space.

* * * * *